(12) United States Patent
Suzuki

(10) Patent No.: US 6,927,130 B2
(45) Date of Patent: Aug. 9, 2005

(54) METHOD OF MANUFACTURING A TRENCH GATE TYPE FIELD EFFECT TRANSISTOR

(75) Inventor: Toshiharu Suzuki, Kanagawa (JP)

(73) Assignee: Sony Corporation, Tokyo (JP)

(*) Notice: Subject to any disclaimer, the term of this patent is extended or adjusted under 35 U.S.C. 154(b) by 47 days.

(21) Appl. No.: 10/343,425

(22) PCT Filed: May 16, 2002

(86) PCT No.: PCT/JP02/04727
§ 371 (c)(1),
(2), (4) Date: Jul. 3, 2003

(87) PCT Pub. No.: WO02/101835
PCT Pub. Date: Dec. 19, 2002

(65) Prior Publication Data
US 2004/0009644 A1 Jan. 15, 2004

(30) Foreign Application Priority Data
May 30, 2001 (JP) ........................ 2001-161892

(51) Int. Cl.⁷ ............................... H01L 21/336
(52) U.S. Cl. .................. 438/259; 438/308; 257/330
(58) Field of Search ............... 438/259, 270, 438/303, 308; 257/330

(56) References Cited

U.S. PATENT DOCUMENTS 6,040,224 A   3/2000  Tsukamoto
6,355,544 B1 * 3/2002  Essaian et al. .............. 438/535
6,365,476 B1 * 4/2002  Talwar et al. ............... 438/308
2004/0089892 A1 * 5/2004  Suzuki ........................ 257/302

FOREIGN PATENT DOCUMENTS

| JP | 55-048926   | 4/1980  |
| JP | 62-243366   | 10/1987 |
| JP | 01-194362   | 8/1989  |
| JP | 02-192168   | 7/1990  |
| JP | 2000-049334 | 2/2000  |

* cited by examiner

Primary Examiner—Asok Kumar Sarkar
(74) Attorney, Agent, or Firm—Sonnenschein, Nath & Rosenthal LLP

(57) ABSTRACT

A trench gate type field effect transistor capable of effectively suppressing the short channel effect is formed with a shallow junction between a source and a drain, at low resistance, and through a simple process. In a method of manufacturing a trench gate type field effect transistor (100A), wherein an impurity introduced layer (13) which is to become a source or a drain is formed by introducing an impurity into a semiconductor substrate (1), a trench (15) is formed in the impurity introduced layer, a gate insulating film (5) is formed on a bottom face of the trench (15), and a gate (G) is formed so as to fill the trench (15), laser annealing for activating the impurity is performed after the impurity is introduced into the semiconductor substrate (1) and before the gate G is formed.

2 Claims, 9 Drawing Sheets

100X

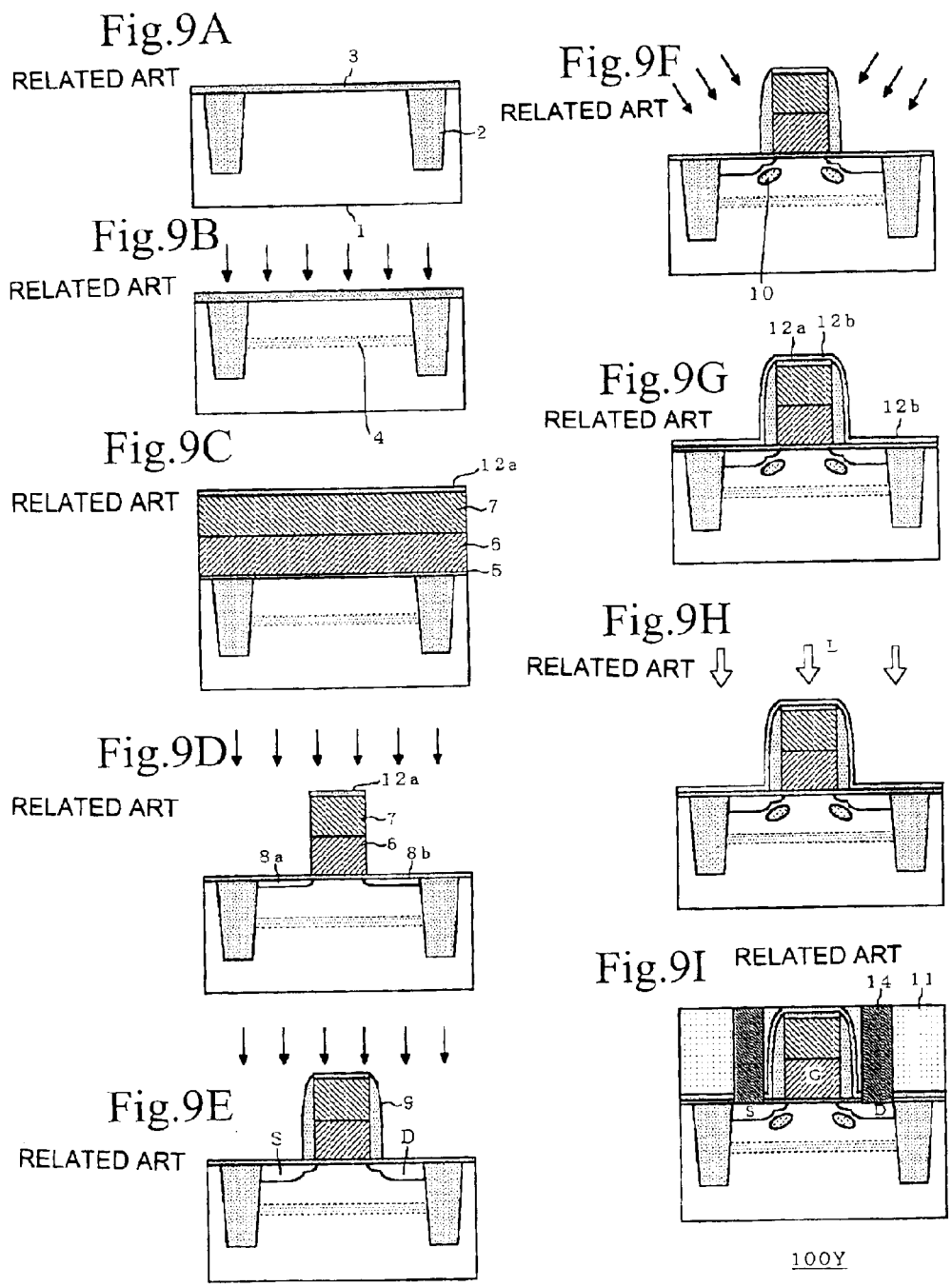

METHOD OF MANUFACTURING A TRENCH GATE TYPE FIELD EFFECT TRANSISTOR

BACKGROUND OF THE INVENTION

The present invention relates to a method of manufacturing a trench gate type field effect transistor which accommodates miniaturization.

MOS type LSIs using silicon substrates are currently in a phase where LSIs with a 0.18-$\mu$m design rule (design criterion) have shifted into mass production, but further improvements in the degree of integration, through miniaturization, are desired, and LSIs with 0.13-$\mu$m to 0.10-$\mu$m design rules are under development. Higher operating speeds and lower power consumption are also desired in these LSIs.

When an LSI is miniaturized and the degree of integration is made larger in scale, suppressing the short channel effect becomes an extremely important issue in reducing deviations in the performance of the individual transistors.

To suppress the short channel effect, in MOS type field effect transistors which are already put to practical use and in which a gate is formed on a semiconductor substrate, and a source and a drain are formed in a self-aligned manner with respect to the gate, attempts to optimize the impurity concentrations or shapes of the source and the drain, well impurity profiles in a channel area and the like are being made, and further, forming an impurity area, commonly referred to as a halo or a pocket, of an opposite conductivity type at an end of the source or the drain through methods such as oblique ion implantation or the like, and suppressing the short channel effect are being attempted.

In addition, for the suppression of the short channel effect, forming the source and the drain shallow while maintaining the low resistivities of the source and the drain becomes a fundamental and important factor.

Conventionally, the activation of impurities introduced into a semiconductor substrate to form a source and a drain is performed through a thermal treatment (900 to 950° C., 20 to 30 minutes) using a resistance heating furnace. In recent years, however, in order to form the source and the drain shallow and low in resistance by preventing impurity diffusion due to this thermal treatment, RTA (Rapid Thermal Annealing) using a halogen lamp is being performed.

In FIG. 3, a typical temperature increase-decrease profile of RTA is shown. In RTA, it rises to an annealing temperature of 1000 to 1100° C. at a rate of rise in temperature of 50 to 100° C., this annealing temperature is maintained for approximately 10 seconds, and natural cooling is performed.

In FIG. 4A to FIG. 4H, a method of manufacturing a typical n-type field effect transistor 100X, in which junctions of a source and a drain are formed using RTA, is shown. In this method, first, element separators 2 are formed in a p-type silicon substrate 1, and a through-film 3 comprising $SiO_2$ or the like is formed (FIG. 4A), and ions are implanted as per the arrows through the through-film 3 to form a well 4 and a $V_{th}$ adjusting layer (not shown) (FIG. 4B). Next, the through-film 3 is removed, and a gate insulating film 5 of approximately 3 to 5 nm is formed through thermal oxidation of 1000° C. and approximately 30 minutes. A polysilicon 6 with a thickness of approximately 500 nm and doped with phosphorus at a high concentration is deposited thereon through low-pressure CVD or the like. Approximately 300 nm of WSi 7 is deposited thereon through the CVD method to reduce gate resistance (FIG. 4C).

Then, a gate pattern with a desired design rule is formed using lithography technology and etching technology. With this gate pattern as a mask, approximately $1\times10^{15}$ cm$^{-2}$ of impurities such as arsenic, which become an extended source 8a and an extended drain 8b, are ion implanted at 10 keV as per the arrows (FIG. 4D). Next, an $SiO_2$ film is deposited by normal CVD and a side wall 9 is formed by performing anisotropic etching. By performing ion implantation again, approximately $3\times10^{15}$ cm$^{-2}$ of arsenic, which forms an impurity introduced layer which is to become a source S and a drain D, is introduced at 30 keV (FIG. 4E).

Next, in order to form a pocket (halo) 10 for suppressing the short channel effect, approximately $1\times10^{13}$ cm$^{-2}$ of a p-type impurity is ion-implanted at an angle of 10° to 30° with respect to the normal to the substrate surface at 20 keV (FIG. 4F). Then, in order to activate the impurities introduced into the substrate 1 up to this point, annealing of 1050° C. and approximately 10 seconds is performed by RTA using a halogen lamp.

Thereafter, an interlayer insulating film 11 of $SiO_2$ or the like is deposited with the CVD method (FIG. 4G). Next, lead electrodes 14 of the source and the drain are formed in the interlayer insulating film 11 to obtain the transistor 100X (FIG. 4H).

However, even when RTA is used for the formation of the junctions of the source and the drain as described above, because cooling through natural radiation is performed after the annealing temperature has been maintained, the rate of fall in temperature during cooling cannot be controlled, and the profile due to the diffusion of the impurities during the fall in temperature presents a problem.

To this end, as shown in FIG. 5, methods such as spike RTA which takes the maintaining time at the annealing temperature to be zero, or quick cooling RTA, in which He gas or the like is used to force cool during the fall in temperature, are adopted.

However, even when these methods are utilized fully, the depth of the junctions and the resistance values of the source and the drain do not reach the values demanded of transistors with a gate length of 130 nm or below in the road map (ITRS '99) in the engineering community as shown in FIG. 6.

In addition, if RTA is performed when an impurity is introduced through ion implantation, point defects, such as numerous interstitial atoms or holes formed due to crystal damage from the impact of the ions, cause enhanced diffusion at the initial stage of the thermal treatment of RTA. Thus, while redistribution of the impurities due to normal thermal diffusion is suppressed considerably, diffusion of the impurities accompanying the enhanced diffusion of the point defects occurs, and the impurity profile causes a significant redistribution.

As such, as an activation method for the impurities, annealing using excimer laser is being considered. In the annealing with excimer laser, since the temperature rises to 1000° C. or higher in an extremely short period of time of several nanoseconds, the impurities can be activated without any accompanying enhanced diffusion. In FIG. 7, the relationship between the depth of junction, the surface resistivity (ohm/square) and the laser energy density (mJ/cm$^2$) of a p+ layer, in which $BF_2$ (15 KeV and $3\times10^{15}$ cm$^{-2}$) is implanted and which is activated with a XeCl excimer laser (a wavelength of 308 nm and a pulse width of 40 nsec), is shown.

In the annealing with excimer laser, since heating is performed in an extremely short period of time, the annealing treatment is performed in a thermally nonequilibrium state. Therefore, as compared with the case where annealing is performed through RTA, forming a shallow and low-resistance junction becomes possible as shown in FIG. 7. However, with the excimer laser, there are cases where a gate thermally insulated from a semiconductor substrate by a gate insulating film reaches a temperature exceeding the melting point of the base material thereof during annealing, and deformation or breakage is brought about due to melting.

To address such a problem, a selective annealing method for performing thermal treatment only on desired sections such as a source and a drain is needed.

As a selective annealing method, there is a method in which, making use of the fact that the reflectance of a laser varies depending on the thickness of a Si oxide film, Si oxide films with different film thicknesses are formed on a material to be irradiated depending on the presence or absence of the necessity of a thermal treatment, and laser is irradiated. More specifically, for example, with respect to an excimer laser of a wavelength of 308 nm, the reflectance of a Si oxide film shows changes with respect to the film thickness of the Si oxide film as shown in FIG. 8. Therefore, in the selective excimer laser annealing method using an excimer laser, an Si oxide film is deposited with a film thickness of 50 nm, at which the reflectance is minimum, on a section in which thermal treatment is desired, and with a film thickness of 100 nm, at which the reflectance is maximum, on a section in which thermal treatment is not desired (H. Tsukamoto et al, Jpn. J. Appl. Phys. 32, L967 (1993)).

In FIG. 9A to FIG. 9I, a method of manufacturing a conventional n-type transistor, in which this selective excimer laser annealing method is used to activate impurities in a source and a drain, is shown. In this method, first, element separators 2 are formed in a p-type silicon substrate 1, a through-film 3 comprising $SiO_2$ or the like is formed (FIG. 9A), and ions are implanted through the through-film 3 to form a well 4 and a $V_{th}$ adjusting layer (not shown) (FIG. 9B). Next, the through-film 3 is removed, approximately 3 to 5 nm through thermal oxidation of 1000° C. and approximately 30 minutes. Thereon, a polysilicon 6 of a thickness of approximately 500 nm and doped with phosphorous at a high concentration is deposited through reduced-pressure CVD or the like. Approximately 300 nm of WSi 7 is deposited thereon through the CVD method to reduce gate resistance, and further, an Si oxide film 12a with a film thickness of 50 nm is deposited through LPCVD or the like (FIG. 9C).

Then, lithography technology and etching technology are used to form a gate pattern with a desired design rule (polysilicon 6/WSi 7/Si oxide film 12a). Then, with this gate pattern as a mask, approximately $1 \times 10^{15}$ $cm^{-2}$ of impurities such as arsenic, which become an extended source 8a and an extended drain 8b, are ion-implanted at 10 keV as per the arrows (FIG. 9D). Next, a side wall 9 is formed by depositing a $SiO_2$ film with a normal CVD method and performing anisotropic etching. By implanting ions again, approximately $3 \times 10^{15}$ $cm^{-2}$ of arsenic which forms an impurity introduced layer which is to become a source S and a drain D is introduced at 30 keV (FIG. 9E).

Next, in order to form a pocket (halo) 10 for suppressing the short channel effect, approximately $1 \times 10^{13}$ $cm^{-2}$ of a p-type impurity is ion-implanted at an angle of 10° to 30° with respect to the normal to the substrate surface at 20 keV (FIG. 9F).

Then, as an anti-reflection film, an Si oxide film 12b is deposited with the CVD method and in a film thickness of 50 nm, at which excimer laser exhibits minimum reflectance. Thus, this Si oxide film 12b of a film thickness of 50 nm is formed on the impurity introduced layer which is to become the source S and the drain D, and on the gate pattern, Si oxide films of a total film thickness, from this Si oxide film 12b and the Si oxide film 12a deposited before the formation of the gate pattern, of 100 nm, in other words of a film thickness at which the reflectance of the excimer laser is maximum, are formed (FIG. 9G).

Next, to activate the impurities introduced into the substrate 1 up to this point, annealing is performed at an energy density of 900 to 1000 $mJ/cm^2$ using an excimer laser L (FIG. 9H).

Thereafter, an interlayer insulating film 11 of $SiO_2$ or the like is deposited with the CVD method, and subsequently, lead electrodes 14 of the source and the drain are formed in the interlayer insulating film 11 to obtain a transistor 100Y (FIG. 9I).

When the transistor 100Y is thus formed with the selective annealing method, because the source S and the drain D, of which the impurities should be activated, alone are heated to a high temperature without having the gate G heated to a high temperature, deformation or breakage of the gate G accompanying annealing can be prevented. In addition, since a thermally non-equilibrium laser annealing is performed in the source S and the drain D, a shallow and low-resistance junction can be formed. Thus, according to this method, it is possible to form a transistor which operates with a gate length of 0.1 $\mu$m or below (H. Tsukamoto et al, Jpn. J. Appl. Phys. 32, L967 (1993)).

In this method, however, because selective laser annealing is performed, the addition and the difficulty of the step accompanies in that the Si oxide films 12a and 12b must be uniformly formed with predetermined film thicknesses over the entire substrate surface before and after the formation of the gate pattern.

As described above, in the conventionally employed method using a resistance heating furnace or the method using RTA, in activating the impurities introduced into the substrate to form the source or the drain of the field effect transistor, it is difficult to form junctions of the source and the drain shallow and with low resistance to an extent that the short channel effect can be effectively suppressed in an extremely miniaturized transistor with a gate length of 0.1 $\mu$m or below.

In addition, when the selective laser annealing method is used, although it is possible to form junctions of the source and the drain shallow and with low resistance, the addition and the difficulty of the step are involved.

To this end, it is an object of the present invention to provide a new method of manufacturing a field effect transistor which forms an extremely miniaturized field effect transistor with junctions of a source and a drain shallow, with low resistance and with a simple process to an extent that the short channel effect can be effectively suppressed.

SUMMARY OF THE INVENTION

The present inventor has found that the formation of the Si oxide film 12a which complicates the process in the conventional selective laser annealing method shown in FIG. 9A to FIG. 9I is required in order to perform laser annealing after the formation of the gate pattern, and therefore that if laser annealing is applied to a trench gate type field effect transistor, in which annealing is performed before the formation of the gate pattern, the step for forming the Si oxide film 12a can be omitted.

In other words, the present invention provides, in a method of manufacturing a trench gate type field effect transistor in which an impurity introduced layer, which is to become a source or a drain, is formed by introducing an impurity into a semiconductor substrate, a trench is formed in the impurity introduced layer, a gate insulating film is formed on a bottom face of the trench, and a gate is formed so as to fill the trench, a method of manufacturing a trench gate type field effect transistor characterized in that laser annealing for activating the impurity is performed after the impurity is introduced into the semiconductor substrate and before the gate is formed.

BRIEF DESCRIPTION OF THE DRAWINGS

FIG. 9A to FIG. 9I are explanatory views of the steps for a method of manufacturing a transistor using a conventional selective laser annealing method.

DETAILED DESCRIPTION OF THE PRESENTLY PREFERRED EMBODIMENTS

Figure 1A:
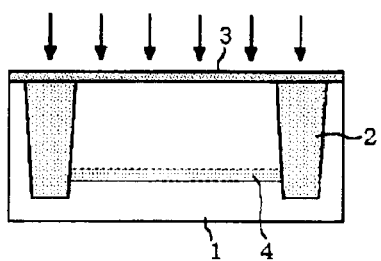
FIG. 1A to FIG. 1I are explanatory views of the steps for a method of manufacturing a transistor of an embodiment.

The present invention is hereinafter described in specific terms with reference to the drawings. In the respective drawings, the same reference numerals represent the same or equivalent elements.

FIG. 1A to FIG. 1I are explanatory views of the steps in an embodiment of a manufacturing method of the present invention for forming an n-type trench gate type MOS (MIS) transistor with an effective gate length of approximately 0.1 $\mu$m.

In the present embodiment, element separators 2 such as shallow trenches are formed in a p-type silicon substrate 1, further, a through-film 3 comprising $SiO_2$ or the like is formed, and ions are implanted through the through-film 3 as per the arrows to form a well 4 and a $V_{th}$ adjusting layer (not shown) (FIG. 1A).

Figure 1B:
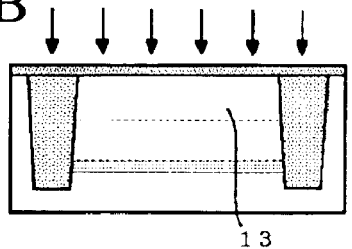
Figure 1C:
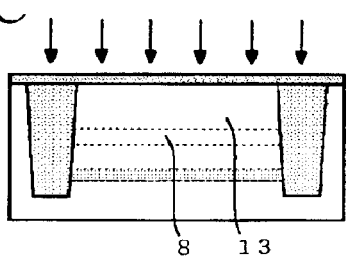

Next, approximately $5 \times 10^{15}$ cm$^{-2}$ of phosphorus, arsenic or the like, which are n-type impurities, is ion-implanted to a depth of approximately 40 nm as per the arrows to form an impurity introduced layer 13, which is to form a source S and a drain D (FIG. 1B). In addition, in order to form an impurity introduced layer 8 corresponding to the extended sources 8a and the extended drains 8b of the conventional type transistors shown in FIG. 4A to FIG. 4H and FIG. 9A to FIG. 9I, approximately $1 \times 10^{15}$ cm$^{-2}$ of an n-type impurity is implanted at a depth approximately 20 nm deeper than the impurity introduced layer 13, which is to form the source S and the drain D (FIG. 1C).

Figure 1D:
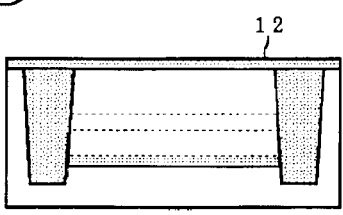

Next, a Si oxide film 12 with a thickness of approximately 50 nm is formed as an anti-reflection film for effectively making an excimer laser be absorbed (FIG. 1D). For this Si oxide film 12, the through-film 3 already formed may be thinned to approximately 50 nm through etching or the like, or an Si oxide film with a film thickness of approximately 50 nm may be re-deposited anew.

Figure 1E:
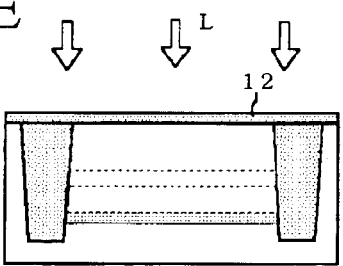

Thereafter, to activate the impurities introduced into the substrate 1 up to this point, laser annealing, in which a XeCl excimer laser L with a wavelength of 308 nm is irradiated at an energy density of approximately 900 mJ/cm$^2$, is performed (FIG. 1E).

Figure 1F:
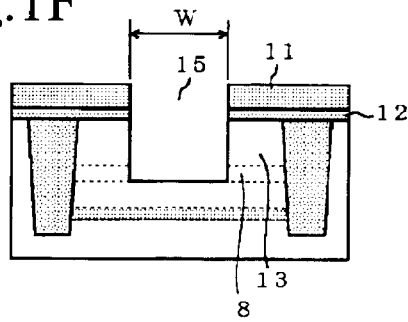

Next, approximately 0.2 to 0.3 $\mu$m of an interlayer insulating film 11 of $Si_3N_4$, $SiO_2$ or the like is deposited through the CVD method, and subsequently, lithography technology using a KrF laser and dry etching technology are used to form a trench 15, which is to form a gate in a center portion of an area sandwiched between the element separators 2, with a width W of 0.1 $\mu$m, penetrating the interlayer insulating film 11 and down to a position deeper than the end of the profile of the impurity introduced layer 8 corresponding to an extended source 8a and an extended drain 8b by several ten nanometers (FIG. 1F).

Figure 1G:
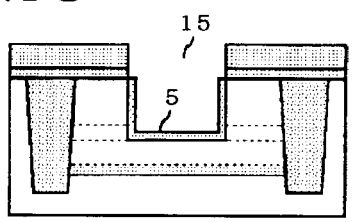

Then, by performing thermal oxidation in dry oxygen of 900° C. and approximately 20 minutes, a gate insulating film 5 comprising an oxide film with a thickness of approximately 2 to 3 nm is grown on the bottom face and the side face of the trench 15 (FIG. 1G). As the gate insulating film 5, a high permittivity insulating film of $Al_2O_3$ or the like may be formed through sputtering or CVD.

Figure 1H:
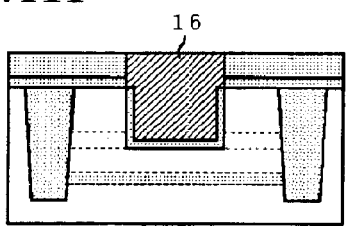

Next, a gate electrode material 16 such as polysilicon/ tungsten silicide, or TiN, Mo or the like which becomes a metal gate is filled inside the trench 15 with the CVD method or the sputtering method, and planarization is performed through CMP or the like to form a gate G (FIG. 1H).

Figure 1I:
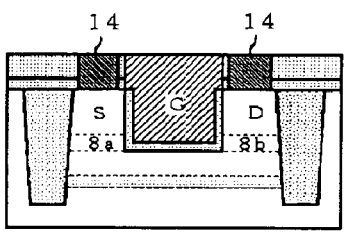

Finally, by opening holes in the interlayer insulating film 11, blanket tungsten or the like is embedded therein, and by removing the excess tungsten by etching back, CMP or the like, lead electrodes 14 of the source S and the drain D are formed to obtain a trench gate type transistor 100A (FIG. 1I).

When the trench gate type transistor 100A is formed in this manner, because the activation of the impurities of the source S, the drain D and others is performed before the formation of the gate, it is possible to form junctions of the source S and the drain D at an extremely shallow depth of approximately 50 nm with a low resistance of approximately 200 ohms/square. In addition, according to this method of manufacture, since it is unnecessary to form Si oxide films of different film thicknesses on the source S, the drain D and the gate G which are conventionally required for selectively performing laser annealing, the transistor manufacturing process can be simplified as compared with the conventional selective laser annealing method. Furthermore, a trench gate type transistor has an advantage in that the short channel effect is structurally less likely to occur since the range between the source S and the drain D is larger than the gate length, and the source S does not directly face the drain D. According to the method of the present embodiment, such a trench gate type transistor can be formed with ease.

FIG. 2A to FIG. 2J are explanatory views of the steps of a different aspect of the present invention for manufacturing a trench gate type MOS (MIS) transistor 100B in which the capacitance between a source, a drain and a gate is lower than that of the transistor 100A shown in FIG. 1A to FIG. 1I.

Figure 2A:
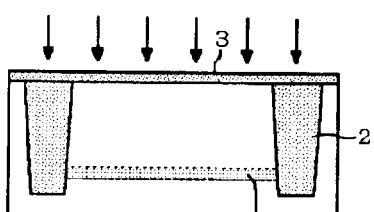
FIG. 2A to FIG. 2J are explanatory views of the steps for a method of manufacturing a transistor in of embodiment.
Figure 2B:
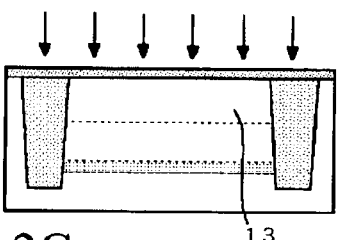
Figure 2C:
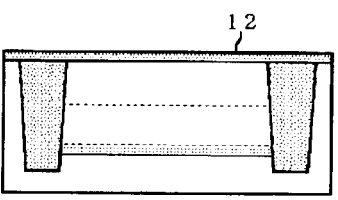
Figure 2D:
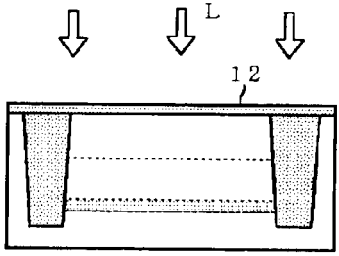

In the present embodiment, as with the transistor 100A shown in FIG. 1A to FIG. 1I, element separators 2, a through-film 3, a well 4, and a $V_{th}$ adjusting layer (not shown) are formed in a p-type silicon substrate 1 (FIG. 2A). An impurity introduced layer 13 for forming a source S and a drain D (FIG. 2B), and, as an anti-reflection film, an Si oxide film 12 with a thickness of approximately 50 nm, for effectively having an excimer laser be absorbed, are formed (FIG. 2C), and laser annealing is performed (FIG. 2D).

Figure 2E:
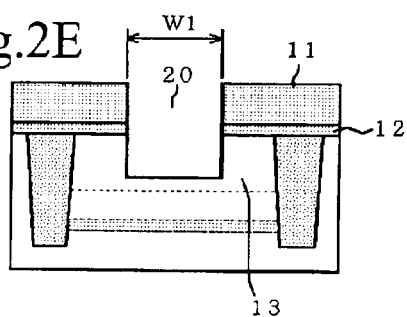

Next, approximately 0.4 to 0.5 μm of an interlayer insulating film 11 of $Si_3N_4$, $SiO_2$ or the like is deposited by the CVD method or the like, and lithography technology using KrF laser and dry etching technology are used to form a first trench 20 in a center portion of an area sandwiched between the element separators 2 with a width W of 0.18 μm, penetrating the interlayer insulating film 11, and at a position shallower than the end of the profile of the impurity introduced layer 13, which is to form the source S and the drain D, by approximately 10 nm (FIG. 2E).

Figure 2F:
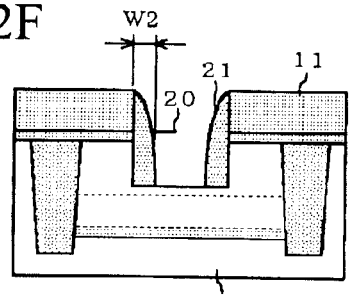

Next, the CVD method is combined with anisotropic etching to form a side wall 21 comprising an insulating material such as $SiO_2$ on the side wall of the first trench 20 with a thickness W2 of approximately 0.05 μm, and the substrate 1 is exposed at the bottom face of the first trench 20 (FIG. 2F).

Figure 2G:
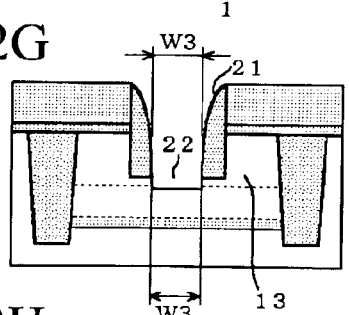

By performing selective etching on the substrate 1 exposed at the bottom face of the first trench 20 with the side wall 21 as a mask, a second trench 22 is formed down to the depth of the end of the profile of the impurity introduced layer 13 or to a depth deeper than the end by approximately several nanometers (FIG. 2G).

Figure 2H:
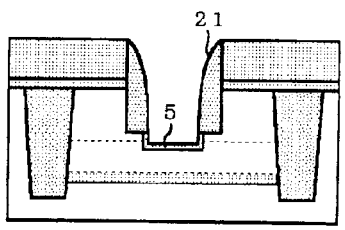

Next, a gate insulating film 5 with a thickness of 2 to 3 nm is formed by thermally oxidizing the bottom face of the second trench 22 in dry oxygen of 950° C. and 20 minutes. Alternatively, a gate insulating film 5 comprising a high permittivity insulating material, such as $Al_2O_3$, is formed using the sputtering method, the normal CVD method, an atomic layer chemical vapor deposition method or the like (FIG. 2H).

Figure 2I:
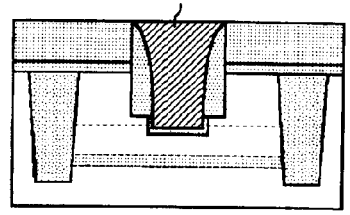

Then, a gate electrode material 16 such as polysilicon/tungsten silicide, or TiN and Mo, which become a metal gate, is filled inside the trench by the CVD method or the sputtering method, and is planarized through CMP or the like (FIG. 2I).

Figure 2J:
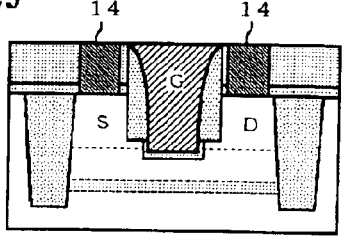
Figure 3:
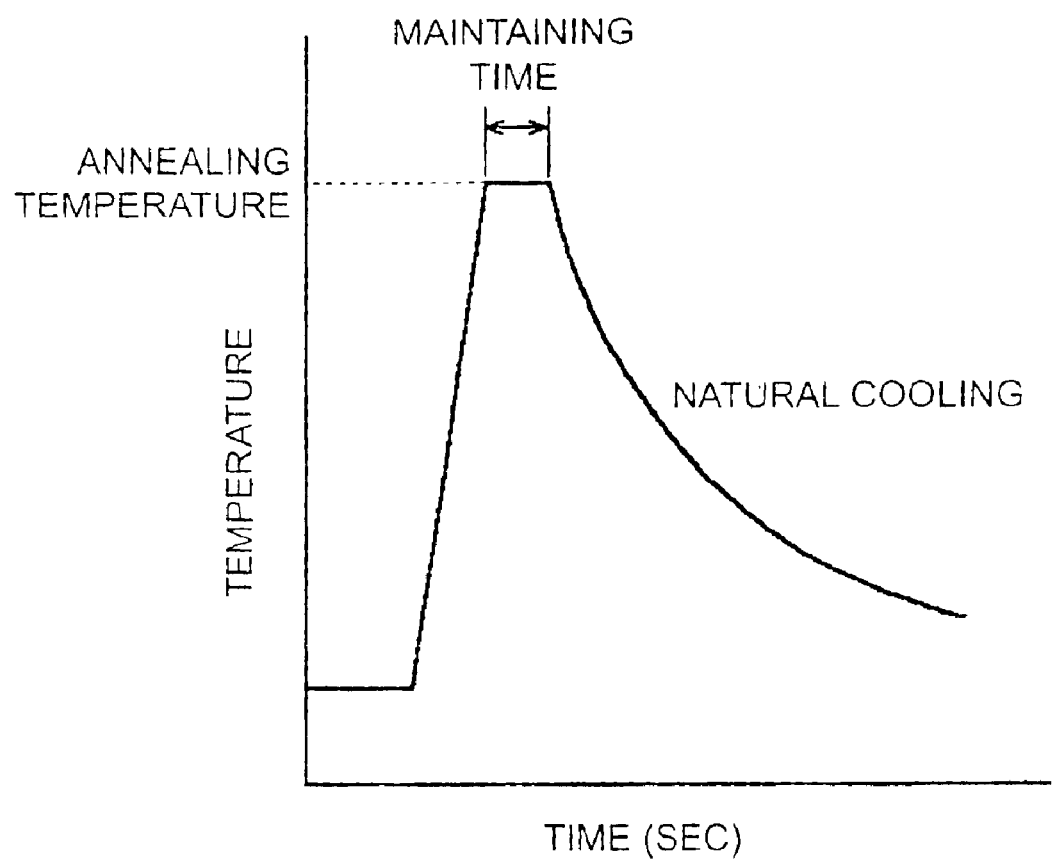
FIG. 3 is a temperature increase-decrease profile of RTA.
Figure 4A:
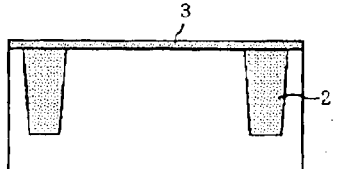
FIG. 4A to FIG. 4H are explanatory views of the steps for a method of manufacturing a conventional n-type transistor.
Figure 4B:
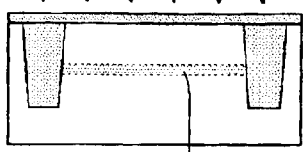
Figure 4C:
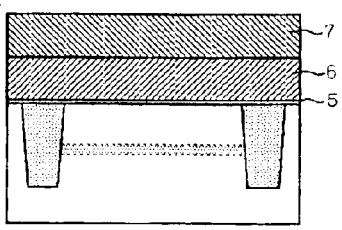
Figure 4D:
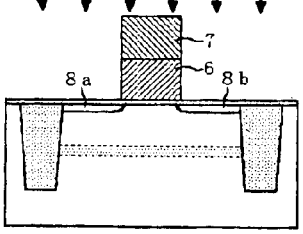
Figure 4E:
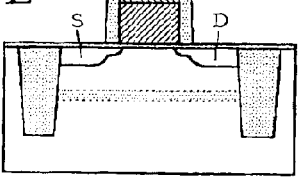
Figure 4F:
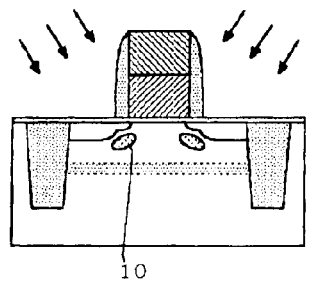
Figure 4G:
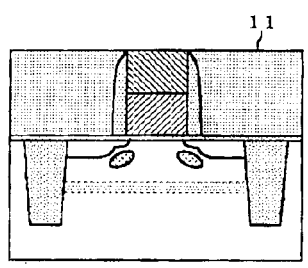
Figure 4H:
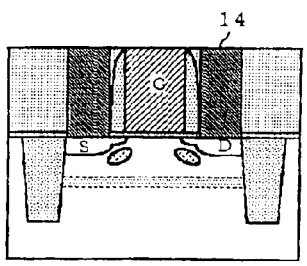
Figure 5:
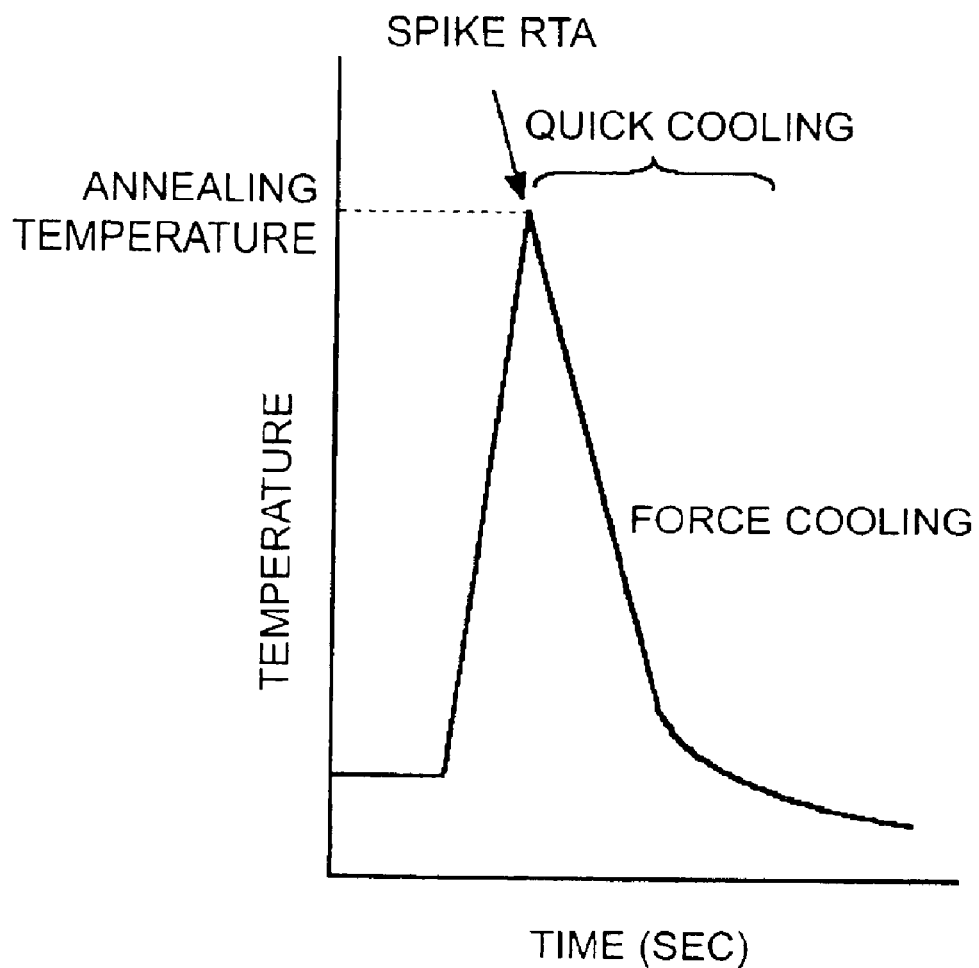
FIG. 5 is temperature increase-decrease profiles in spike RTA and quick cooling RTA.
Figure 6:
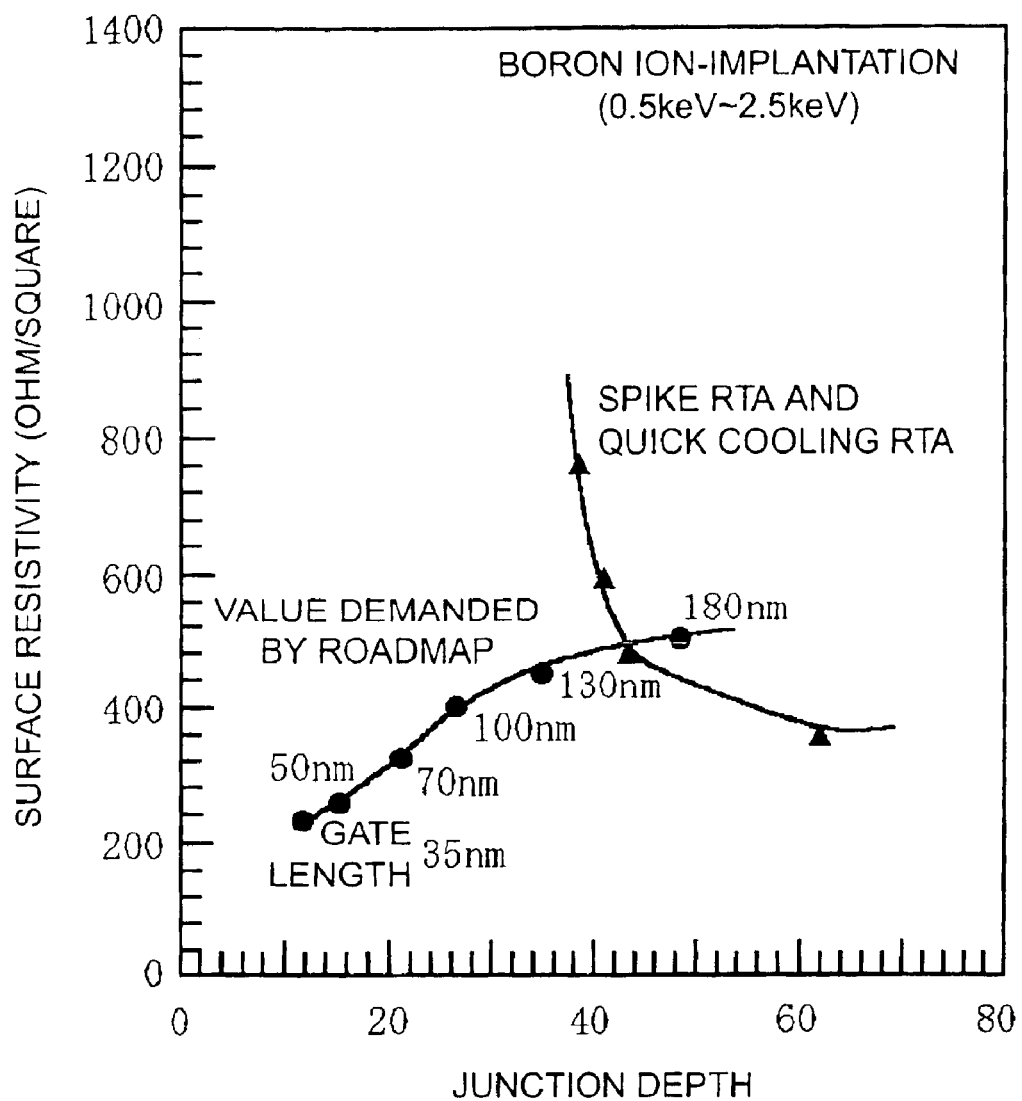
FIG. 6 is a diagram of the relationship between the junction depth and the surface resistivity of a p-n junction formed using spike RTA and quick cooling RTA.
Figure 7:
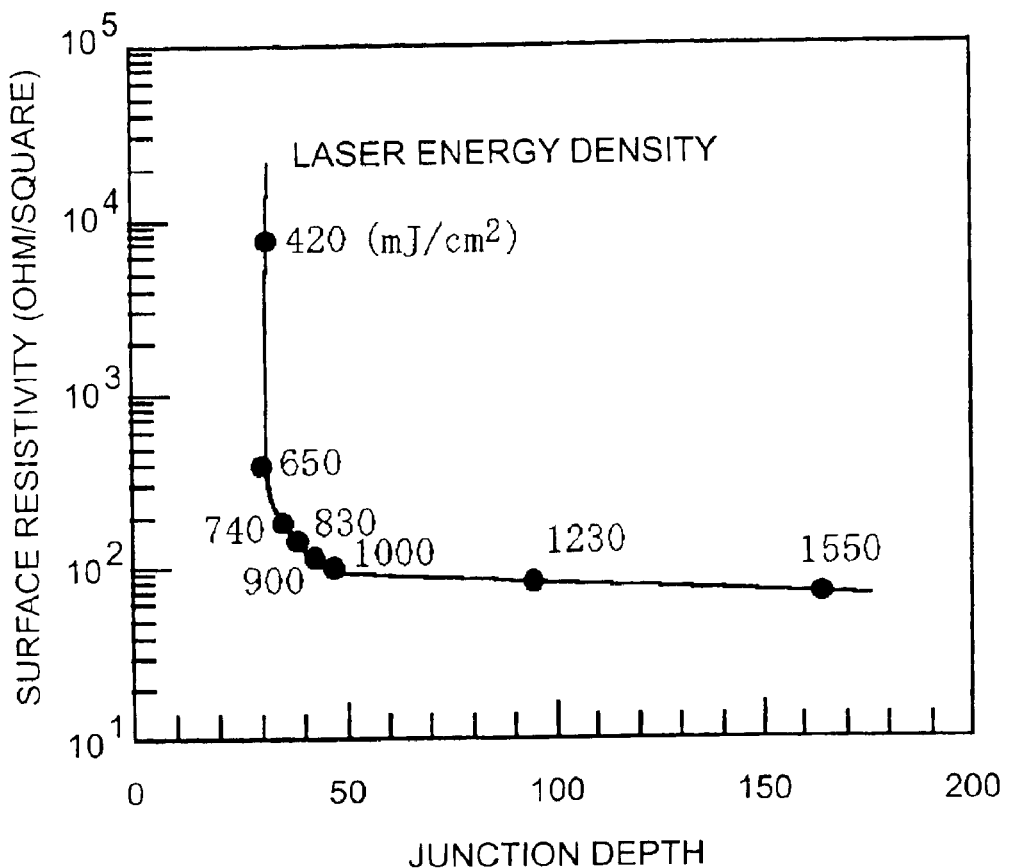
FIG. 7 is a diagram of the relationship between junction depth, surface resistivity, and laser energy density in excimer laser annealing.
Figure 8:
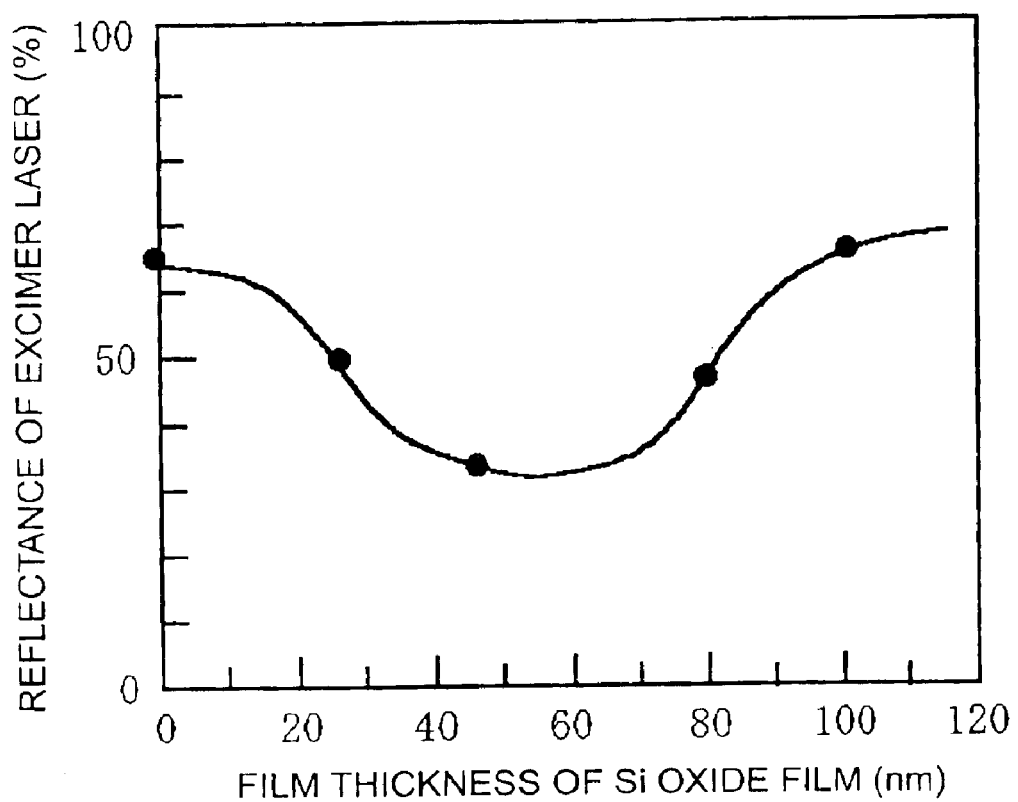
FIG. 8 is a diagram of the relationship between the film thickness and the reflectance of an excimer laser with respect to a Si oxide film.

Finally, as with the transistor 100A in FIG. 1A to FIG. 1I, lead electrodes 14 of the source S and the drain D are formed to obtain the transistor 200B (FIG. 2J).

When the trench gate type transistor 100B is formed in this manner, as with the trench gate type transistor 100A in FIG. 1A to FIG. 1I, laser annealing is performed with a simplified process as compared to the conventional selective laser annealing method, and a transistor with low resistance and in which the junctions of the source S and the drain D are extremely shallow can be obtained.

Further, according to this manufacturing method for the trench gate type transistor 100B, since the the source S or the drain D and the gate G are separated by the side wall 21, the capacitance between the source S or the drain D and the gate G can be reduced significantly. This capacitance reducing effect is further effective since the extremely shallow source S and drain D are formed.

In addition, because the second trench 22 is formed with the side wall 21 in a self-aligned manner with respect to the first trench 20, and a width W3 of the second trench 22 is formed narrower than the width W1 of the first trench 20, the width W3 of the second trench 22 is automatically formed with a width narrower than the lithography capabilities which define the first trench 20. More specifically, for example, when the width W1 of the first trench 20 is taken to be 0.18 μm and the width W2 of the side wall 21 is taken to be 0.05 μm, it follows that the width W3 of the second trench 22 will be formed to be 0.08 μm. Thus, according to the present embodiment, it becomes possible to form a miniaturized transistor with an extremely short gate length of 0.08 μm or below, which is considered difficult even with KrF lithography currently used in practice.

In the formation of the trench gate type transistor 100B having the first and second trenches and shown in FIG. 2A to FIG. 2J, as with the trench gate type transistor 100A shown in FIG. 1A to FIG. 1I, an impurity introduced layer corresponding to an extended source and an extended drain may also be formed. In such a case, laser annealing is performed after the impurity introduced layer corresponding to the extended source and the extended drain is formed in the substrate, and thereafter, the first trench is formed.

Alternatively, the impurity introduced layer corresponding to the extended source and the extended drain is formed after the formation of the first trench 20, and thereafter, laser annealing is performed. In this case, the thickness of the interlayer insulating film 11 is formed thinner than in the case shown in FIG. 2A to FIG. 2J so that sufficient absorption of the laser is performed. After the laser annealing, as in the method shown in FIG. 2A to FIG. 2J, the side wall is formed, the second trench is formed, the gate insulating film is formed in the second trench, and these trenches are filled with the gate metal material to form the transistor.

The present invention can take various modes other than these. For example, while in the aforementioned embodiments, an example in which a XeCl excimer laser with a wavelength of 308 nm is used is indicated, excimer lasers such as KrF and ArF may also be used. Further, as long as it can be irradiated with a suitable energy density, it is not limited to excimer lasers, and other lasers may also be used.

In addition, while in the aforementioned embodiments, manufacturing methods for n-type MOS or MIS transistors are described, by reversing the conductivity types of the substrate and the impurities, it can likewise be applied to p-type transistors as well.

The metals used as the material for forming the gate or the high-permittivity insulating film used as the gate insulating film are also not limited to the aforementioned examples. It is possible to select, as deemed appropriate, materials which are stable materials and have good moldability and which are metals with proper work functions or high-permittivity insulating materials with a proper band gap.

The thicknesses of the various films, the impurity concentrations, the depths of the impurity layers and the like, too, are not limited to the aforementioned examples, and can be optimized depending on the gate length, $V_{th}$, the current driving capability, and other desired characteristics of the transistor to be formed.

According to the present invention, since the activation of the impurities which are to form the source, the drain or the like is performed through laser annealing in the manufacturing process for the trench gate type transistor, it is possible to form an extremely miniaturized trench gate type transistor having a gate length of 0.1 μm or below with the extremely shallow junctions of the source and the drain and with low resistance, and through a simplified process. By virtue of the fact that the junction between the source and the drain can be formed extremely shallow, the capacitance between the source or the drain and the gate can be significantly reduced.

In addition, according to the present invention, by virtue of the fact that the junction between the source and the drain can be formed extremely shallow, it becomes possible to form the trench, in which the gate is embedded, itself shallow, and deviations in the effective gate length due to deviations in the processing accuracy of etching and the like can be reduced. Thus, reductions in deviations of drain currents or $V_{th}$ are facilitated.

What is claimed is:

1. In a method of manufacturing a trench gate type field effect transistor wherein an impurity introduced layer, which becomes a source or a drain, is formed by introducing an impurity into a semiconductor substrate, a trench is formed in the impurity introduced layer, a gate insulating film is formed on a bottom face of the trench, and a gate is formed so as to fill the trench, a method of manufacturing a trench gate type field effect transistor characterized in that laser annealing for activating the impurity is performed after the impurity is introduced into the semiconductor substrate and before the gate is formed, wherein a flat anti-reflection film is formed on a flat surface of the semiconductor substrate and laser annealing is performed after the impurity is introduced into the semiconductor substrate and before the trench is formed.

2. In a method of manufacturing a trench gate type field effect transistor wherein an impurity introduced layer, which becomes a source or a drain, is formed by introducing an impurity into a semiconductor substrate, a trench is formed in the impurity introduced layer, a gate insulating film is formed on a bottom face of the trench, and a gate is formed so as to fill the trench, a method of manufacturing a trench gate type field effect transistor characterized in that laser annealing for activating the impurity is performed after the impurity is introduced into the semiconductor substrate and before the gate is formed, wherein a flat anti-reflection film is formed on a flat surface of the semiconductor substrate and laser annealing is performed after the impurity is introduced into the semiconductor substrate and before the trench is formed, and a side wall comprising an insulating material is formed on a side wall of that trench, a second trench is formed in a bottom face of said trench with the side wall as a mask, a gate insulating film is formed on a bottom face of the second trench, and a gate is formed so as to fill these trenches.

* * * * *